United States Patent
Lin et al.

(10) Patent No.: US 10,164,062 B2
(45) Date of Patent: *Dec. 25, 2018

(54) FINFET DEVICE HAVING A CHANNEL DEFINED IN A DIAMOND-LIKE SHAPE SEMICONDUCTOR STRUCTURE

(71) Applicant: Taiwan Semiconductor Manufacturing Company, Ltd., Hsin-Chu (TW)

(72) Inventors: You-Ru Lin, New Taipei (TW); Cheng-Hsien Wu, Hsinchu (TW); Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/357,782

(22) Filed: Nov. 21, 2016

(65) Prior Publication Data

US 2017/0069736 A1 Mar. 9, 2017

Related U.S. Application Data

(60) Continuation of application No. 14/492,920, filed on Sep. 22, 2014, now Pat. No. 9,502,539, which is a
(Continued)

(51) Int. Cl.
*H01L 29/66* (2006.01)
*H01L 29/78* (2006.01)
(Continued)

(52) U.S. Cl.
CPC .. *H01L 29/66795* (2013.01); *H01L 21/02532* (2013.01); *H01L 21/02609* (2013.01);
(Continued)

(58) Field of Classification Search
CPC ..... H01L 21/823431; H01L 21/823821; H01L 29/785; H01L 29/66795; H01L 27/10826
See application file for complete search history.

(56) References Cited

U.S. PATENT DOCUMENTS 6,969,659 B1 * 11/2005 Anderson ......... H01L 29/66545
257/346
7,521,376 B2 4/2009 Frank et al.
(Continued)

*Primary Examiner* — Julia Slutsker
(74) *Attorney, Agent, or Firm* — Haynes and Boone, LLP

(57) ABSTRACT

The present disclosure provides a FinFET device. The FinFET device comprises a semiconductor substrate of a first semiconductor material; a fin structure of the first semiconductor material overlying the semiconductor substrate, wherein the fin structure has a top surface of a first crystal plane orientation; a diamond-like shape structure of a second semiconductor material disposed over the top surface of the fin structure, wherein the diamond-like shape structure has at least one surface of a second crystal plane orientation; a gate structure disposed over the diamond-like shape structure, wherein the gate structure separates a source region and a drain region; and a channel region defined in the diamond-like shape structure between the source and drain regions.

20 Claims, 18 Drawing Sheets

Related U.S. Application Data division of application No. 13/220,979, filed on Aug. 30, 2011, now Pat. No. 8,841,701.

(51) Int. Cl.
| | |
|---|---|
| *H01L 29/04* | (2006.01) |
| *H01L 21/02* | (2006.01) |
| *H01L 21/306* | (2006.01) |
| *H01L 29/16* | (2006.01) |
| *H01L 29/161* | (2006.01) |
| *H01L 29/165* | (2006.01) |
| *H01L 21/762* | (2006.01) |
| *H01L 29/06* | (2006.01) |
| *H01L 29/08* | (2006.01) |

(52) U.S. Cl.
CPC .. *H01L 21/30604* (2013.01); *H01L 21/76224* (2013.01); *H01L 29/045* (2013.01); *H01L 29/0649* (2013.01); *H01L 29/0847* (2013.01); *H01L 29/16* (2013.01); *H01L 29/161* (2013.01); *H01L 29/165* (2013.01); *H01L 29/7853* (2013.01)

(56) References Cited

U.S. PATENT DOCUMENTS

| | | |
|---|---|---|
| 7,671,420 B2 | 3/2010 | Shin et al. |
| 2009/0026505 A1* | 1/2009 | Okano ............. H01L 29/66795 257/255 |
| 2009/0267196 A1 | 10/2009 | Dyer et al. |
| 2009/0283829 A1 | 11/2009 | Dyer et al. |
| 2011/0073952 A1 | 3/2011 | Kwok et al. |
| 2011/0298058 A1* | 12/2011 | Kawasaki ......... H01L 29/66795 257/401 |
| 2013/0049068 A1 | 2/2013 | Lin et al. |
| 2015/0011068 A1 | 1/2015 | Lin et al. |

* cited by examiner

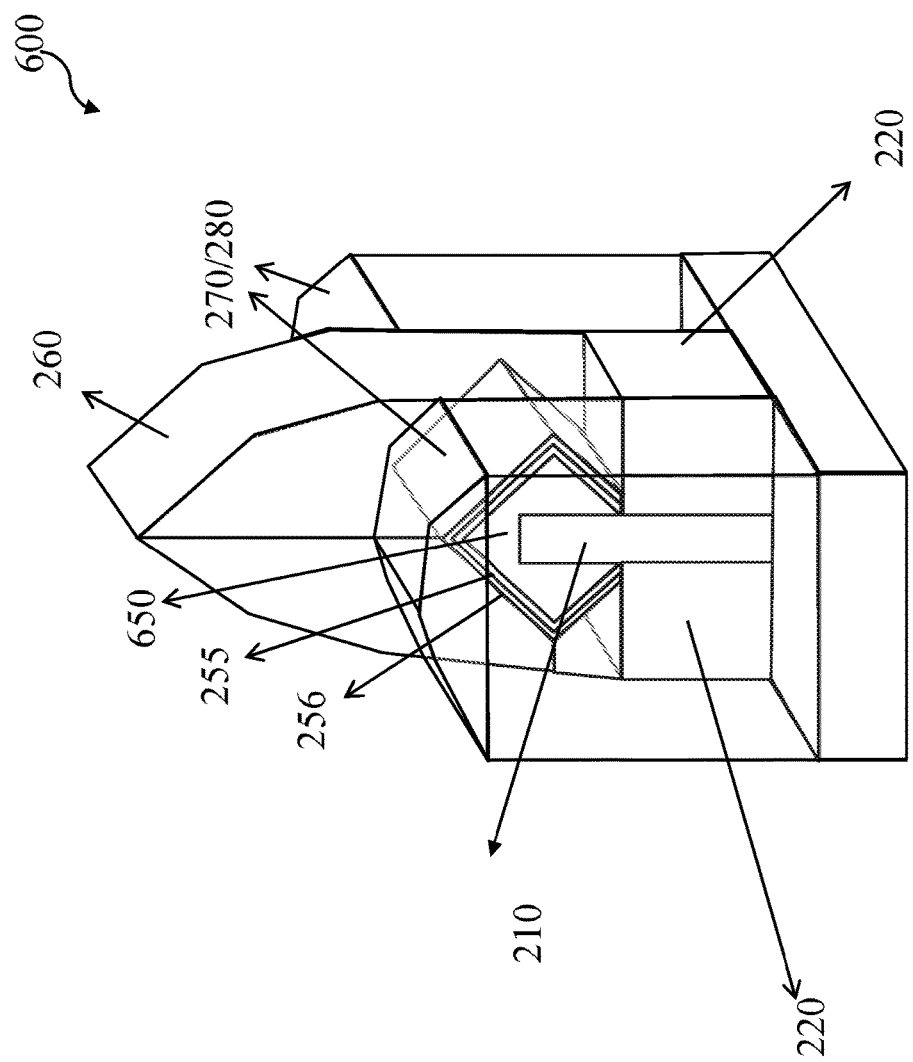

FINFET DEVICE HAVING A CHANNEL DEFINED IN A DIAMOND-LIKE SHAPE SEMICONDUCTOR STRUCTURE

PRIORITY DATA

The present application is a continuation application of U.S. patent application Ser. No. 14/492,920, filed Sep. 22, 2014, which is a divisional application of U.S. patent application Ser. No. 13/220,979, filed Aug. 30, 2011, now U.S. Pat. No. 8,841,701, each of which is incorporated herein by reference in its entirety.

BACKGROUND

As the semiconductor industry has progressed into nanometer technology process nodes in pursuit of higher device density, higher performance, and lower costs, challenges from both fabrication and design have resulted in the development of three dimensional designs, such as nonplanar multigate transistors, gate-all-around field-effect transistors (GAA FET), and fin-like field effect transistors (FinFETs). As an example, a typical FinFET is fabricated with a thin "fin" (or fin structure) extending from a substrate, for example, etched into a silicon layer of the substrate. The channel of the FinFET is formed in the vertical fin. A gate is provided over (e.g., wrapping) the fin. It is beneficial to have a gate on both sides of the channel allowing gate control of the channel from both sides. Research and development has explored not only materials of fin but also shape of fin for better device performance including higher carrier mobility and better quality of interface between the material of fin. Although existing FinFETs and methods for fabricating FinFETs have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 18 is a perspective view of a FinFET device with a diamond-like shape gate structure at a fabrication stage according to the method of FIG. 13.

DETAILED DESCRIPTION

Figure 1:
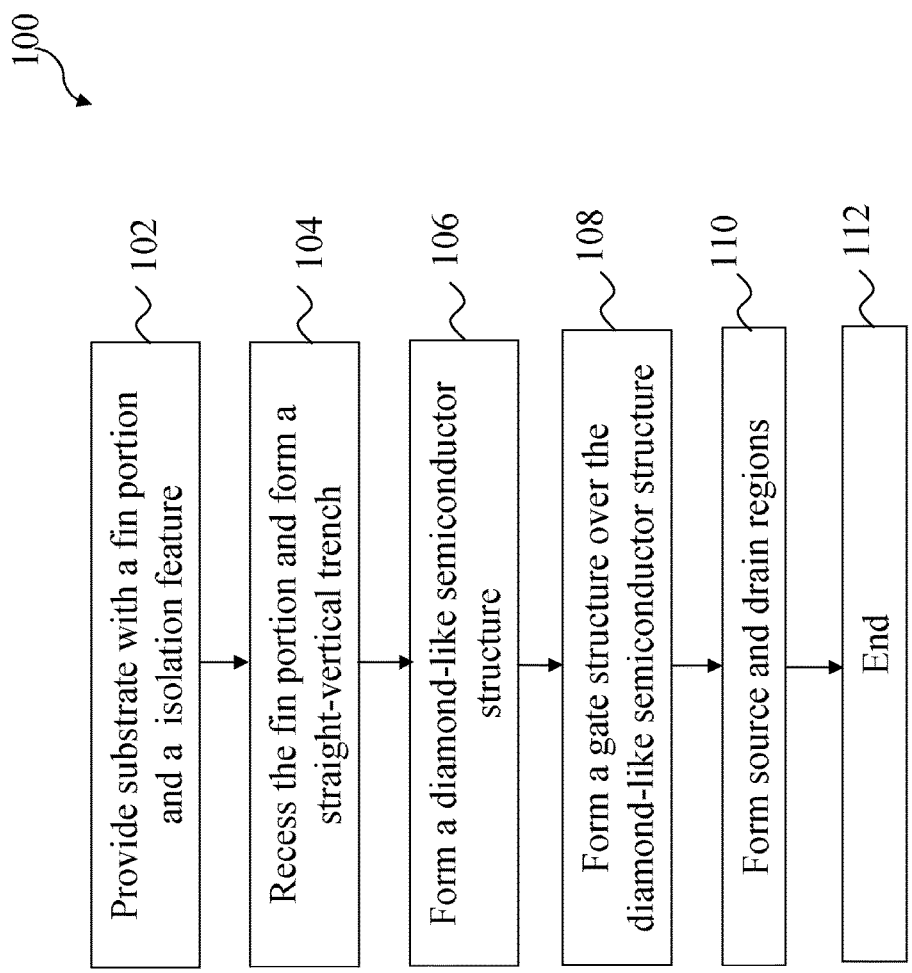
FIG. 1 is a flow chart of a method for fabricating a FinFET device with a diamond-like shape gate structure according to aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 100 for fabricating a device according to various aspects of the present disclosure. The method 100 begins at block 102 wherein a substrate having a fin portion and an isolation feature is provided. The isolation feature is formed by patterning, etching, and depositing techniques. At block 104, a fin portion recess is performed to form a straight-vertical trench. At block 106, a semiconductor material epitaxially grows from the fin portion within the straight-vertical trench and grows over the straight-vertical trench to form a diamond-like shape semiconductor structure. At block 108, a gate structure is formed over the diamond-like shape semiconductor structure. At block 110, source and drain regions are formed. At block 112, formation of the device is completed. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

Figure 4:
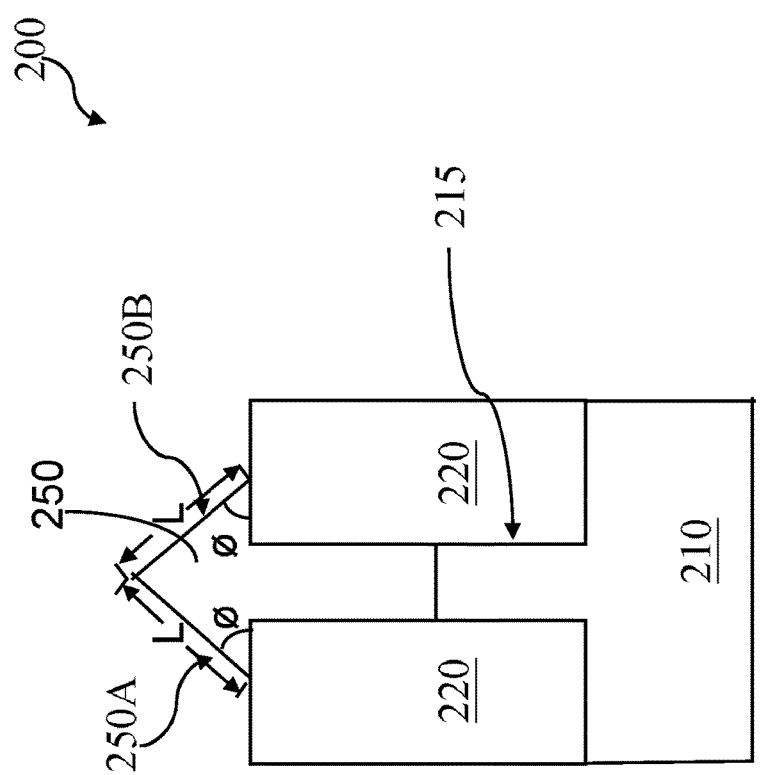
Figure 5:
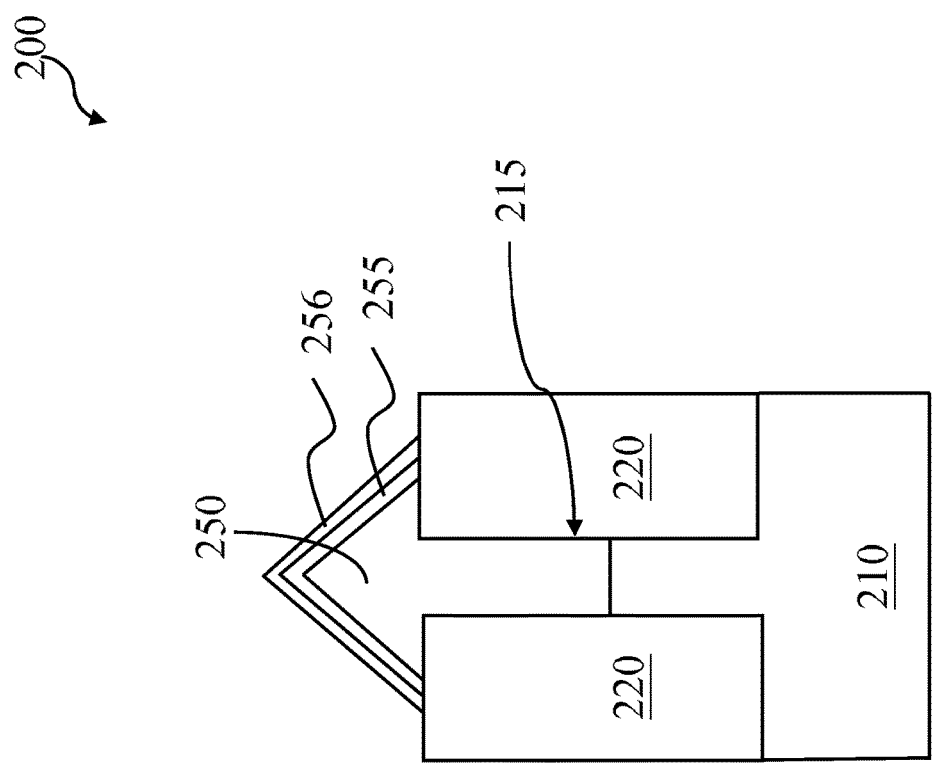
Figure 6:
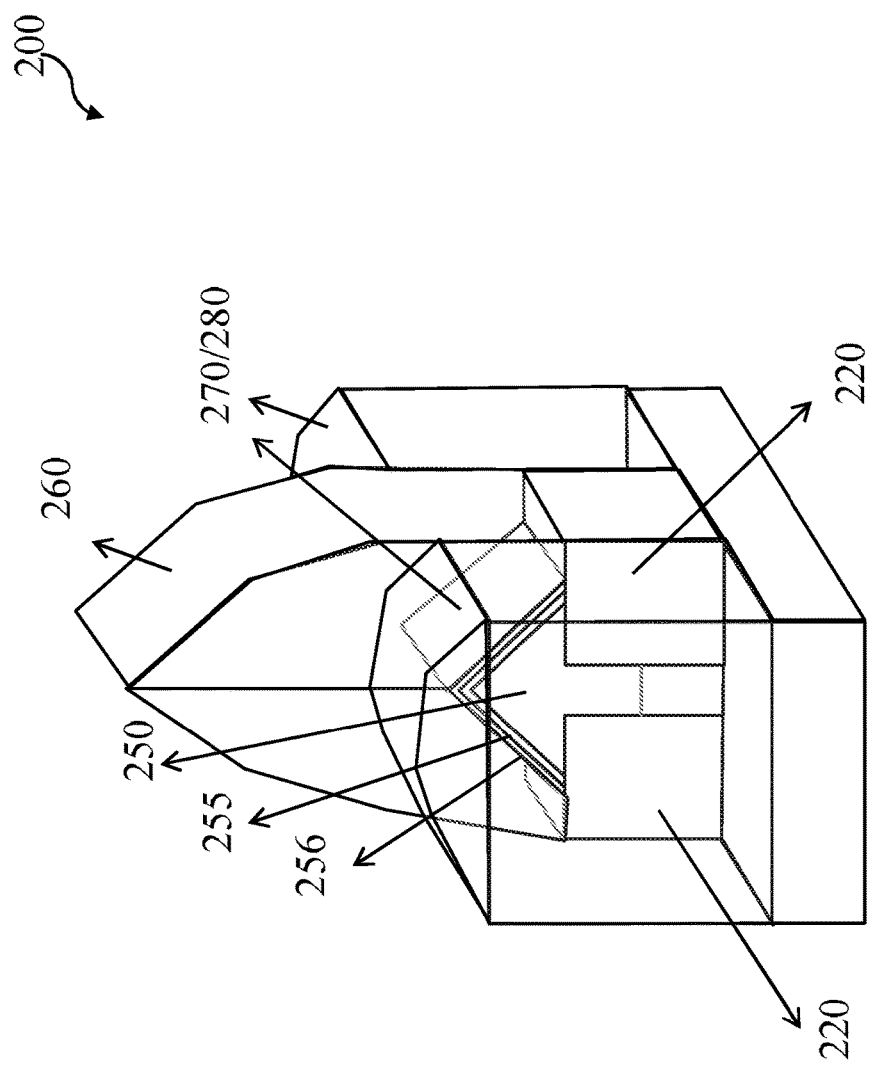
FIG. 6 is a perspective view of a FinFET device with a diamond-like shape gate structure at a fabrication stage according to the method of FIG. 1.

FIGS. 2-5 are various diagrammatic cross-sectional views, and FIG. 6 is a perspective view, of a device 200, in portion or entirety, at various stages of fabrication according to the method 100 of FIG. 1. The device 200 includes a diamond-like shape semiconductor structure that may serve as a gate channel of a field-effect transistor (FET), metal-oxide-semiconductor field-effect transistor (MOSFET), a fin-like FET (FinFET); or a 3-D substrate of microelectromechanical systems (MEMS) device. In the depicted embodiment, the diamond-like shape semiconductor structure is a portion of a gate structure of a FinFET device, where a channel will be induced by a positive or negative charge on the gate structure. FIGS. 2-6 have been simplified for the sake of clarity to better understand the inventive concepts of the present disclosure. Additional features can be added in the device 200, and some of the features described below can be replaced or eliminated in other embodiments of the device 200.

Figure 2:
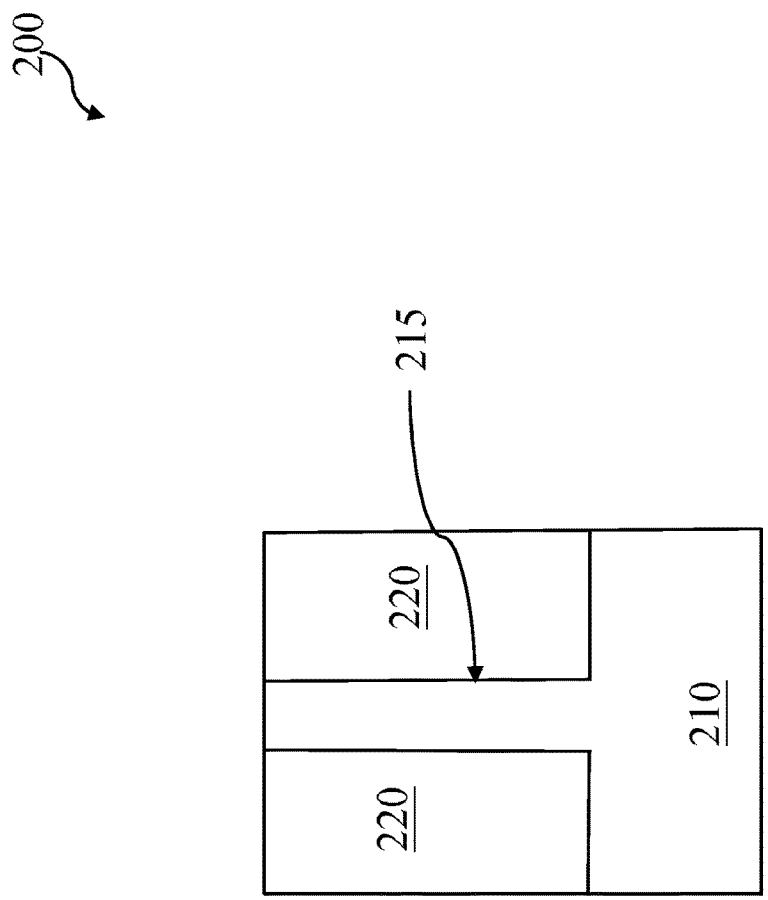
FIGS. 2-5 are various diagrammatic cross-sectional views of a FinFET device with a diamond-like shape gate structure at various fabrication stages according to the method of FIG. 1.

FIG. 2 illustrates a substrate 210 with a fin portion 215. The substrate 210 includes silicon. Alternatively, the substrate 210 may include other elementary semiconductor such as germanium. The substrate 210 may include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. The substrate 210 may include an epitaxial layer. For example, the substrate 210 may have an epitaxial layer overlying a bulk semiconductor. Furthermore, the substrate 210 may include a semiconductor-on-insulator (SOI) structure. The substrate 210 comprises any suitable crystallographic orientation [e.g., a (100), (110), or (111) crystallographic orientation]. The substrate 210 may further include a notch aligned along any suitable direction (e.g., a <110> or <100> direction). In the present embodiment, the substrate 210 includes Si with a top surface having a (100) crystalline (plane) orientation, Si (100).

The fin portion 215 is a portion of the substrate 210 that is disposed between an isolation feature 220. The isolation feature 220 includes a dielectric material, such as silicon oxide, silicon nitride, a low dielectric constant (low k) material, or a combination thereof. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials as examples. In order to form the isolation feature 220, the substrate 210 is etched to form a plurality of trenches by lithography and etch processes. The trenches may define the fin portion 215 of the substrate 210. A trench etching technique includes a medium-density plasma etch using coupled plasmas, or a high-density plasma etch that utilizes either inductive, helicon, or electron cyclotron resonance (ECR) plasmas, or other suitable etch techniques. A hard etch mask technique may be added to the processes. The trenches are then filled by a dielectric material and the excess dielectric material is removed thereafter. A trench filling technique includes chemical vapor deposition (CVD), high density plasma (HDP) CVD, sub-atmospheric pressure CVD (SACVD), and spin-on dielectric (SOD). A removing excess dielectric material technique includes a chemical-mechanical polishing (CMP), an etching, or a combination thereof.

An example of the isolation feature 220 formation is a shallow trench isolation (STI) process. The STI processes may include depositing a pad oxide layer over a substrate, such as the substrate 210; depositing a mask layer over the pad oxide layer; patterning the mask layer; using the patterned mask as a mask to etch the pad oxide layer and the substrate to form a trench in the substrate; depositing a dielectric layer over the substrate that fills the trench; removing any dielectric layer above the mask layer; and thereafter, removing the mask layer and the pad oxide layer. The isolation feature 220 can prevent electrical current leakage between adjacent device components.

Figure 3:
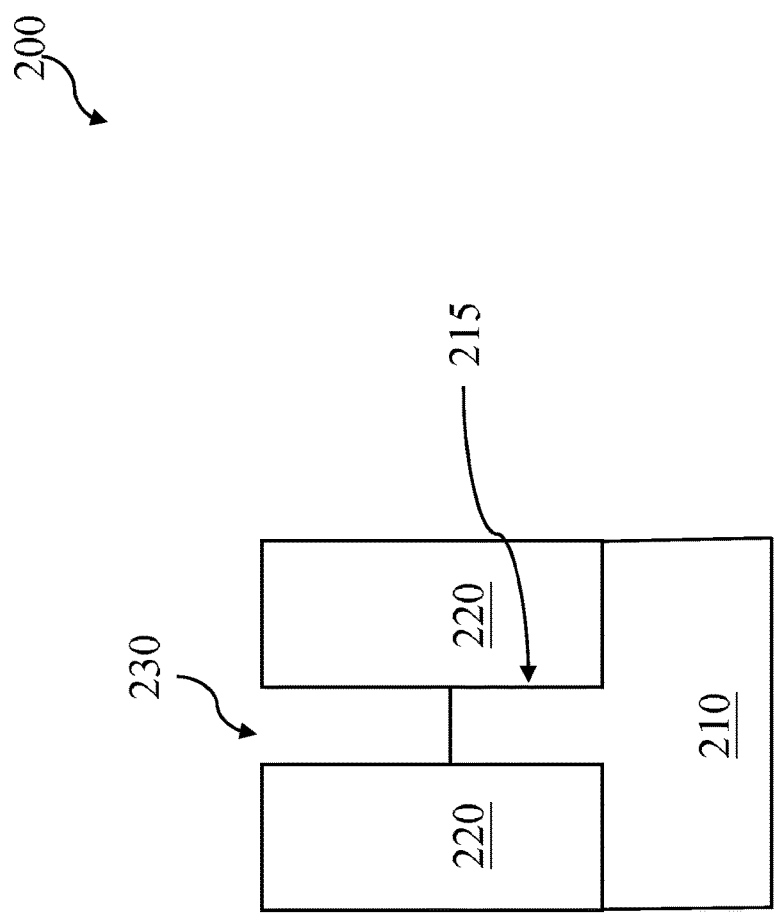

FIG. 3 illustrates forming a trench 230 by recessing the fin portion 215. The trench 230 may be formed by a selective wet etch or a selective dry etch. A wet etching solution includes a tetramethylammonium hydroxide (TMAH), a HF/HNO3/CH3COOH solution, or other suitable solution. The selective dry etch may include in-situ chemical vapor etching (CVE). In the depicted embodiment, the trench 230 is formed with a straight-vertical sidewall profile. Sidewalls of the trench 230 are substantially and vertically parallel to each other.

In FIG. 4, a semiconductor material grows epitaxially from the fin portion 215 and continually grows above the trench 230 to form a semiconductor structure 250. The epitaxial growth techniques include liquid phase epitaxy (LPE), physical vapor deposition (PVD), molecular beam epitaxy (MBE), or chemical vapor deposition (CVD). LPE deposits an epitaxial layer from a supersaturated solution, and the chosen solvent generally has a low melting point and a low vapor pressure. The growth temperature can be well below the melting point of the compound semiconductor which is being decomposed and the equipment is simple, inexpensive and non-hazardous. PVD is a sublimation process, which is based on sublimation of a semiconductor (or compound semiconductor) source and transport of vapor species to the growing surface. MBE epitaxially grows semiconductor material via the interaction of one or more molecular or atomic beams with a surface of a heated crystalline substrate. The growth of semiconductor material can be controlled precisely at the monolayer level. CVD deposits film by thermally induced reaction of a molecule on a heated surface. The heat breaks up the molecules and deposits the desired atoms on the surface, layer by layer. A special type of CVD is metal organic CVD (MOCVD), which has one or more of the precursors include an organic-metal such as TMGe or TMAl.

The semiconductor structure 250 includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The semiconductor structure 250 has any suitable crystallographic orientation (e.g., a (100), (110), or (111) crystallographic orientation). When choosing a semiconductor, considerations include its properties such as junction forward voltage, mobility of electron and hole, leakage current level, and quality of interface between the semiconductor material and other materials, such as oxide materials. In the depicted embodiment, the semiconductor structure 250 includes Ge. Ge has a higher electron mobility than Si. The electron mobility of Ge with (111) crystallographic orientation, Ge (111), is higher than Ge (100). Ge (111) also provides a good interface between Ge (111) and oxide materials, such as $GeO_2$. Accordingly, in the depicted embodiment, the semiconductor structure 250 includes Ge (111). In the depicted embodiment, Ge (111) epitaxially grows from the fin portion 215 within the trench 230. The Ge (111) continually grows to form the semiconductor structure 250, which extends above the trench 230.

In FIG. 4, the semiconductor structure 250 has a diamond-like shape, meaning that the semiconductor structure 250 has at least one facet having a (111) crystallographic orientation. In the depicted embodiment, the semiconductor structure 250 has two facets, 250A and 250B. Each facet has a (111) crystallographic orientation. The facets 250A and 250B have a fixed angle ø with a surface of the isolation feature 220. As an example, the angle ø is about 54.7 degree. The facet 250A starts from the top surface of the isolation feature 220, and meets an end of the facet 250B; which also starts from the top surface of the isolation feature 220. Lengths L of the facets 250A and 250B are substantially the same and can be controlled by the epitaxial growth process conditions, such as growth rate and growth time.

In the depicted embodiment, the semiconductor structure 250 serves as a channel of the device 200, specifically a n-channel FinFET device. FIGS. 5 and 6 illustrate forming a gate structure over the diamond-like shape semiconductor structure 250. The gate structure traverses the diamond-like shape semiconductor structure 250. The gate structure includes one or more material layers, such as interfacial layers, capping layers, diffusion/barrier layers, dielectric layers, electrode layers, conductive layers, other suitable layers, or combinations thereof. For example, the gate structure may include gate dielectric layers, such as dielectric layers 255 and 256, and a gate electrode 260. The gate structure is formed by any suitable process. For example, the gate structure is formed by a procedure including deposition, lithography patterning, and etching processes. For a further example, the gate structure may include disposing a dielectric material on sidewalls of the gate structure (referred to as spacers), such as along the gate electrode 260. The spacers include a dielectric material, such as silicon oxide, silicon nitride, silicon oxynitride, other suitable material, or combinations thereof. The spacers may include a multi-layer structure, such as a multi-layer structure including a silicon nitride layer and a silicon oxide layer.

In FIG. 5, dielectric layers 255 and 256 are deposited over the diamond-like shape semiconductor structure 250 to from a portion of the gate structure. In the depicted embodiment, the dielectric layers 255 and 256 include $GeO_2$ and $Y_2O_3$, respectively. The dielectric layers 255 and 256 may include silicon oxide, germanium oxide, silicon nitride, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The dielectric layers 255 and 256 may be deposited by chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof.

In FIG. 6, the gate electrode 260 includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof.

A source structure and a drain structure are separated by the gate structure. In order to form source/drain, 270/280, a semiconductor material can be epitaxially grown on the exposed surfaces of the substrate 210 or the fin portion 215. In the depicted embodiment, the source/drain 270/280 are formed by epitaxially growing a semiconductor material on exposed portion of the substrate 210. The epitaxy process may use CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 210. In the depicted embodiment, the source/drain 270/280 include epitaxially grown silicon. Alternatively, the source/drain 270/280 could comprise epitaxially grown Ge, SiGe, or other compound semiconductors. The source/drain 270/280 may be doped during deposition (growth) by adding impurities to the source material of the epitaxy process or subsequent to its deposition growth process by an ion implantation process. The doped epitaxial layer may have a gradient doping profile. The doping species may depend on the type of device being fabricated such as an NMOS or a PMOS device. The doping species include p-type dopants, such as boron or $BF_2$; n-type dopants, such as phosphorus or arsenic; or combinations thereof. One or more annealing processes may be performed to activate the S/D regions. The annealing processes comprise rapid thermal annealing (RTA), laser annealing processes, or other suitable annealing processes.

Figure 7:
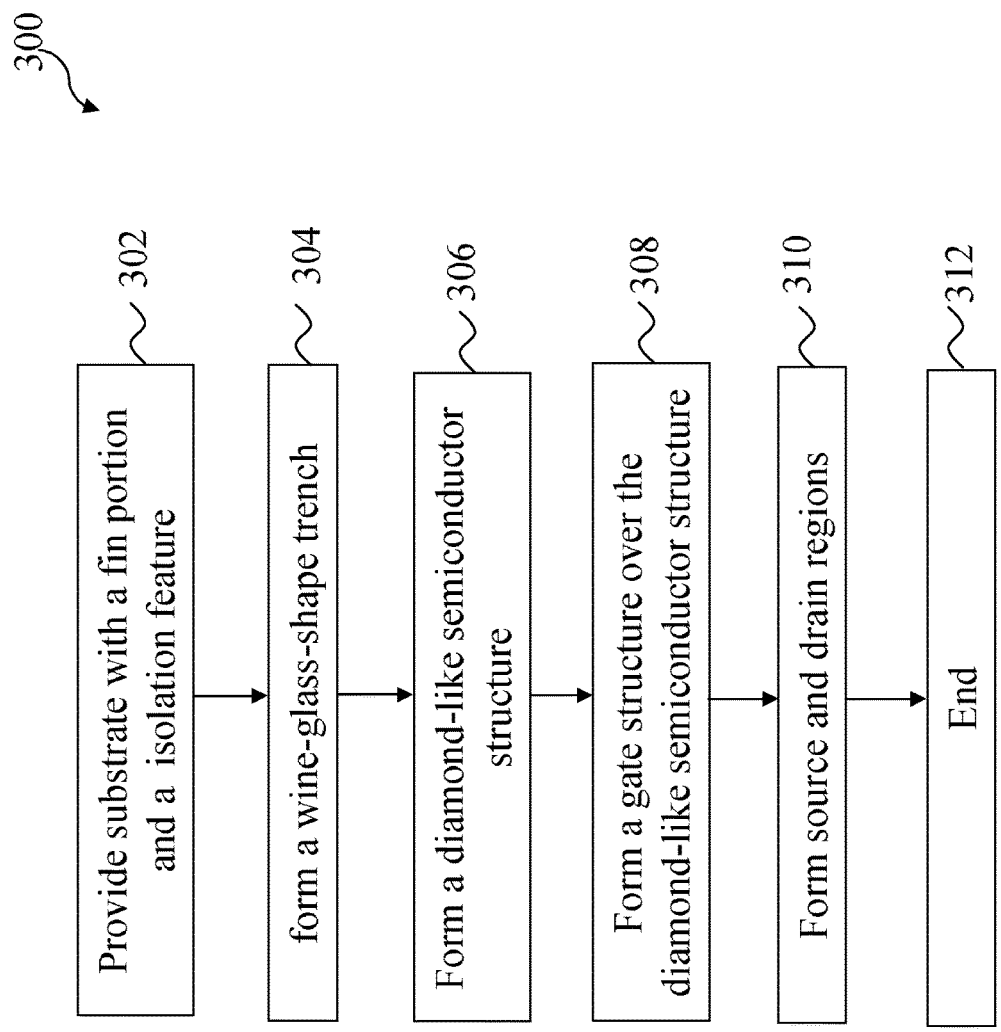
FIG. 7 is a flow chart of a method for fabricating a FinFET device with another diamond-like shape gate structure according to aspects of the present disclosure.

FIG. 7 is a flow chart of a method 300 for fabricating another device according to various aspects of the present disclosure. The method 300 begins at block 302 wherein a substrate with a fin portion structure and an isolation feature is provided. At block 304, two etch back processes are performed to form a trench with a wine-glass shape. At block 306, a semiconductor material epitaxially grows from the fin portion within the wine-glass shape trench and grows over the wine-glass shape trench, and forms a diamond-like shape semiconductor structure on top of the wine-glass shape trench. At block 308, a gate structure is formed over the diamond-like shape semiconductor structure. At block 310, source and drain regions are formed. At block 312, formation of the device 400 is completed. Additional steps can be provided before, during, and after the method 300, and some of the steps described can be replaced or eliminated for other embodiments of the method. The discussion that follows illustrates various embodiments of an integrated circuit device that can be fabricated according to the method 300 of FIG. 7.

Figure 10:
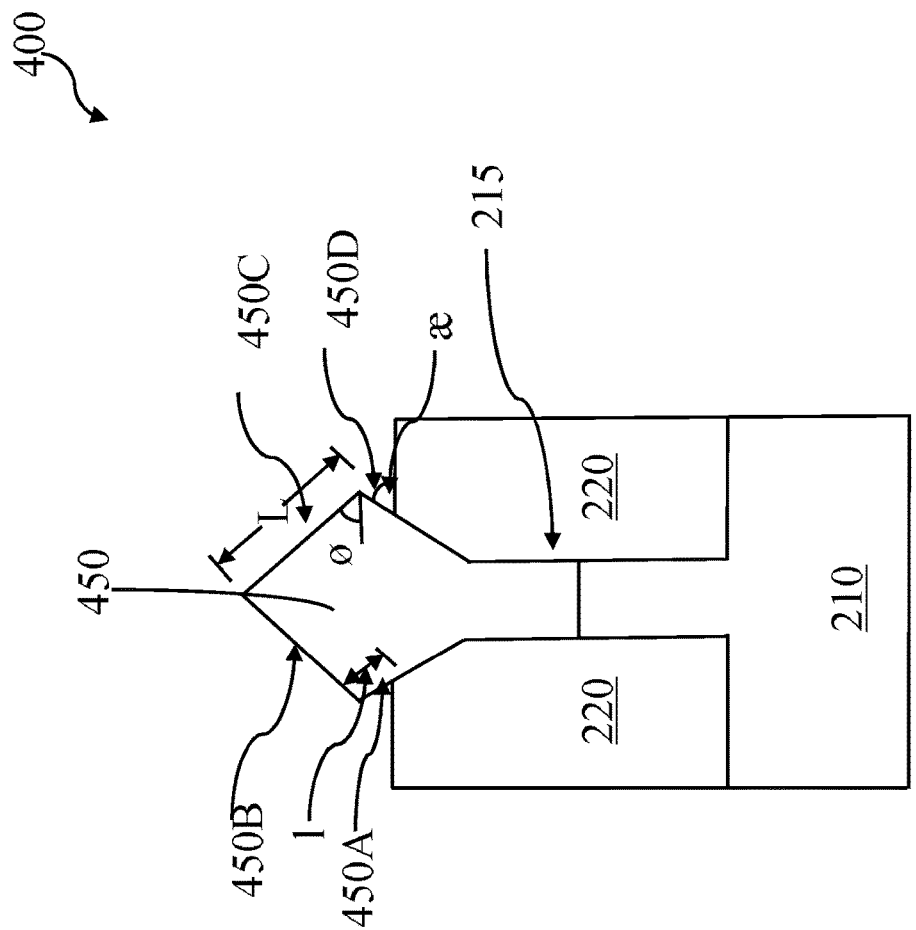
Figure 11:
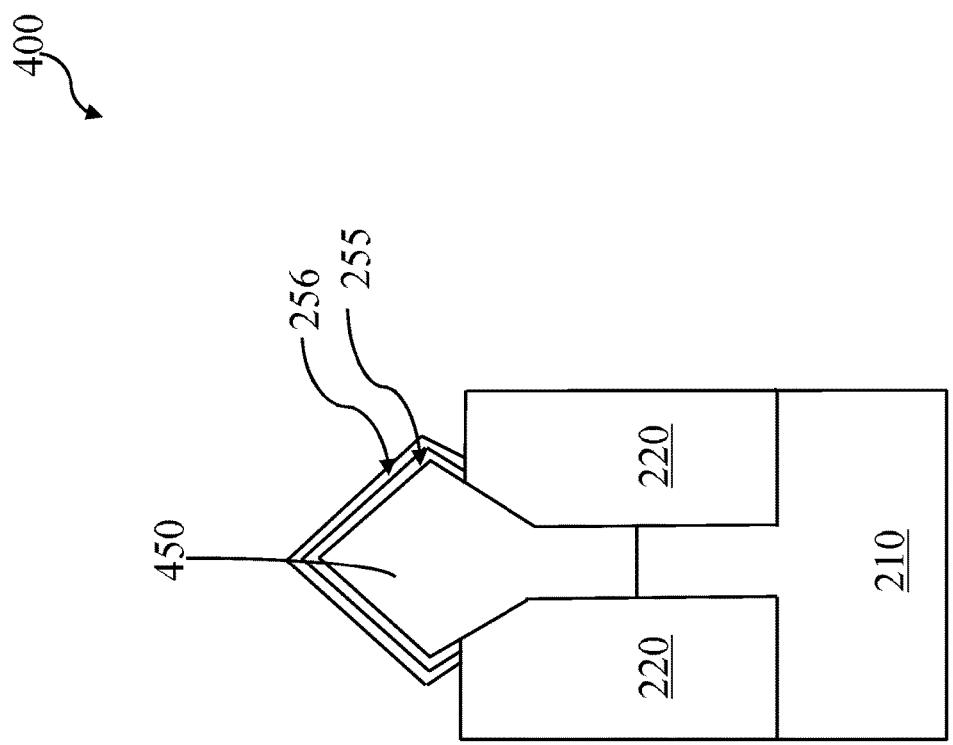
Figure 12:
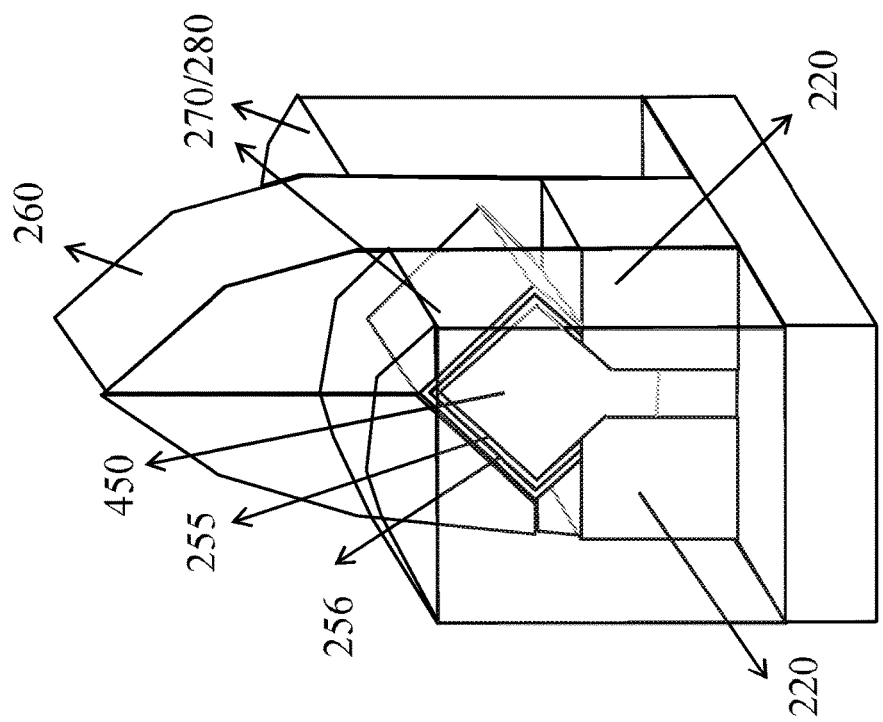
FIG. 12 is a perspective view of a FinFET device with a diamond-like shape gate structure at a fabrication stage according to the method of FIG. 7.

FIGS. 8-11 are various diagrammatic cross-sectional views, and FIG. 12 is a perspective view, of a device 400, in portion or entirety, at various stages of fabrication according to the method 300 of FIG. 7. The device 400 includes another diamond-like shape semiconductor structure that may serve as a gate channel of a FET, a MOSFET, a FinFET; or a 3-D substrate of a MEMS device. In the depicted embodiment, the diamond-like shape semiconductor structure is a portion of a gate structure of a FinFET device, where a channel will be induced by a positive or negative charge on the gate structure. FIGS. 8-12 have been simplified for the sake of clarity to better understand the inventive concepts of the present disclosure. Additional features can be added in the device 400, and some of the features described below can be replaced or eliminated in other embodiments of the device 400.

Figure 8:
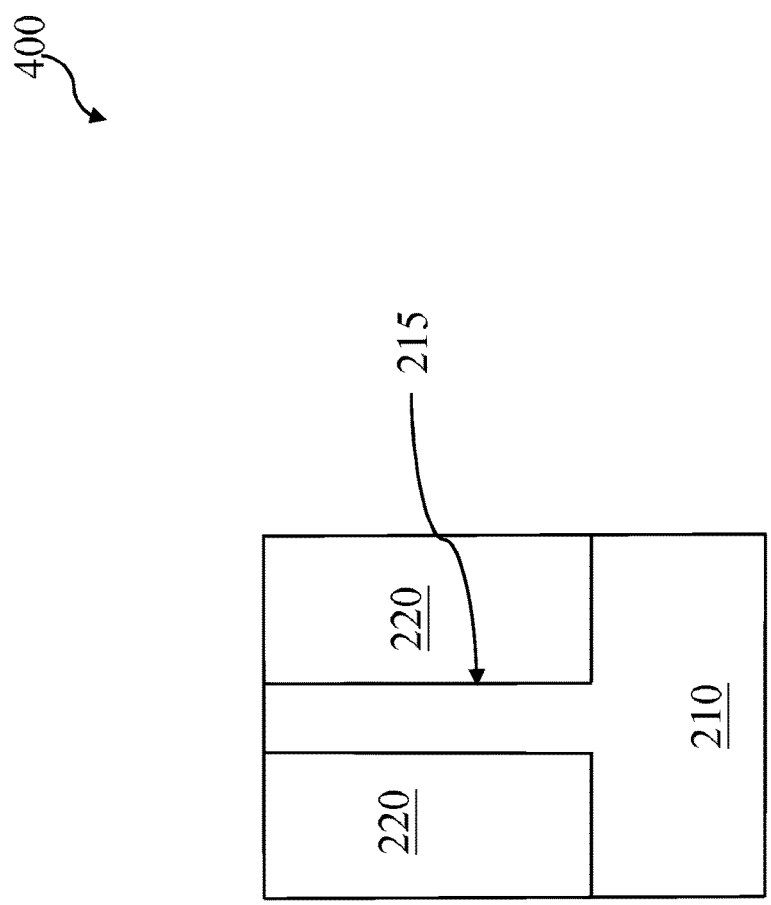
FIGS. 8-11 are various diagrammatic cross-sectional views of a FinFET device with a diamond-like shape gate structure at various fabrication stages according to the method of FIG. 7.

FIG. 8 illustrates the substrate 210 with the fin portion 215 and the isolation feature 220 disposed therein. The substrate 210, the fin portion, and the isolation feature 220 are described in FIG. 2 above.

Figure 9:
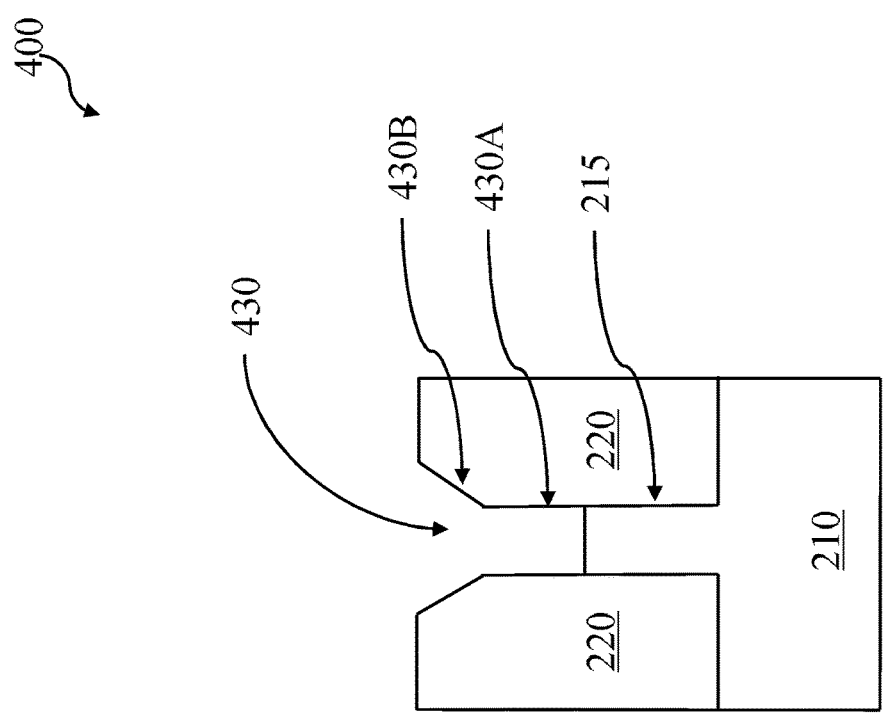

FIG. 9 illustrates forming a trench 430 with two sidewall profile portions, a lower portion 430A and an upper portion 430B. The lower portion 430A has a sidewall profile that is the same as the trench 230 with a straight-vertical profile, as described in FIG. 3. The upper portion 430B has a sidewall profile that is a tapered profile, which has a wider opening on the top and a narrower opening on the bottom, which is connected with the lower portion 430A. The sidewall tapered profile of the upper portion 430B is formed by recessing the isolation feature 220. A recess technique may include a buffered HF wet etch, NH3/NF3 and SF6/H2O down—flow dry etch, or any suitable etch technique. The combination of the straight-vertical profile of the lower portion 430A and the tapered profile of the upper portion 430B may be referred to as a wine-glass-shape profile. In the depicted embodiment, the trench 430 thus has a wine-glass-shape profile.

In FIG. 10, a semiconductor material grows epitaxially from the fin portion 215 and continually grows above the trench 430 to form a semiconductor structure 450. The formation of the semiconductor structure 450 is similar in many respects to the formation of the semiconductor structure 250, described in FIG.4. In the depicted embodiment, Ge (111) epitaxially grows from the fin portion 215 within the wine-glass-shape trench 430. The Ge (111) continually grows to form the semiconductor structure 450, which extends above the opening of the trench 430. In FIG. 10, the semiconductor structure 450 has a diamond-like shape, meaning that the semiconductor structure 450 has at least one facet having a (111) crystallographic orientation. In the depicted embodiment, the semiconductor structure 450 has four facets, 450A, 450B, 450C and. Each facet has a (111) crystallographic orientation. The diamond-like shape is similar to a rhombus shape, meaning that the facet 450A is parallel to the facet 450C and the facet 450B is parallel to the facet 450D. Facets 450A and 450D have a fixed angle (æ) with the surface of the isolation feature 220. Facets 450B and 450D have a fixed angle (ø) with a direction, which parallels with the surface of the isolation feature 220. As an example, the (angle ø) is 54.7 degree as well as the (angle æ). In the depicted embodiment, facets 450A and 450D have same length (l), and facets 450B and 450C have the same length (L). The length (l) represents the length of the facet 450A from the surface of isolation feature to the facet 450B. The length (L) represents the length of the facet 450B from the facet 450A to the facet 450C. Both lengths, L and l, can be controlled by epitaxial growth process condition, such as growth rate and growth time.

In the depicted embodiment, the semiconductor structure 450 serves as a channel of the device 400, specifically a n-channel FinFET device. In FIGS. 11 and 12, the gate structure including the gate dielectric layers 255 and 256; and the gate electrode 260 are formed over the diamond-like shape semiconductor structure 450.In FIG. 12, the source/drain 270/280 is formed. A formation of the gate structure, source region, and drain region of the device is similar in many respects to the device 200 of FIGS. 5 and 6.

Figure 13:
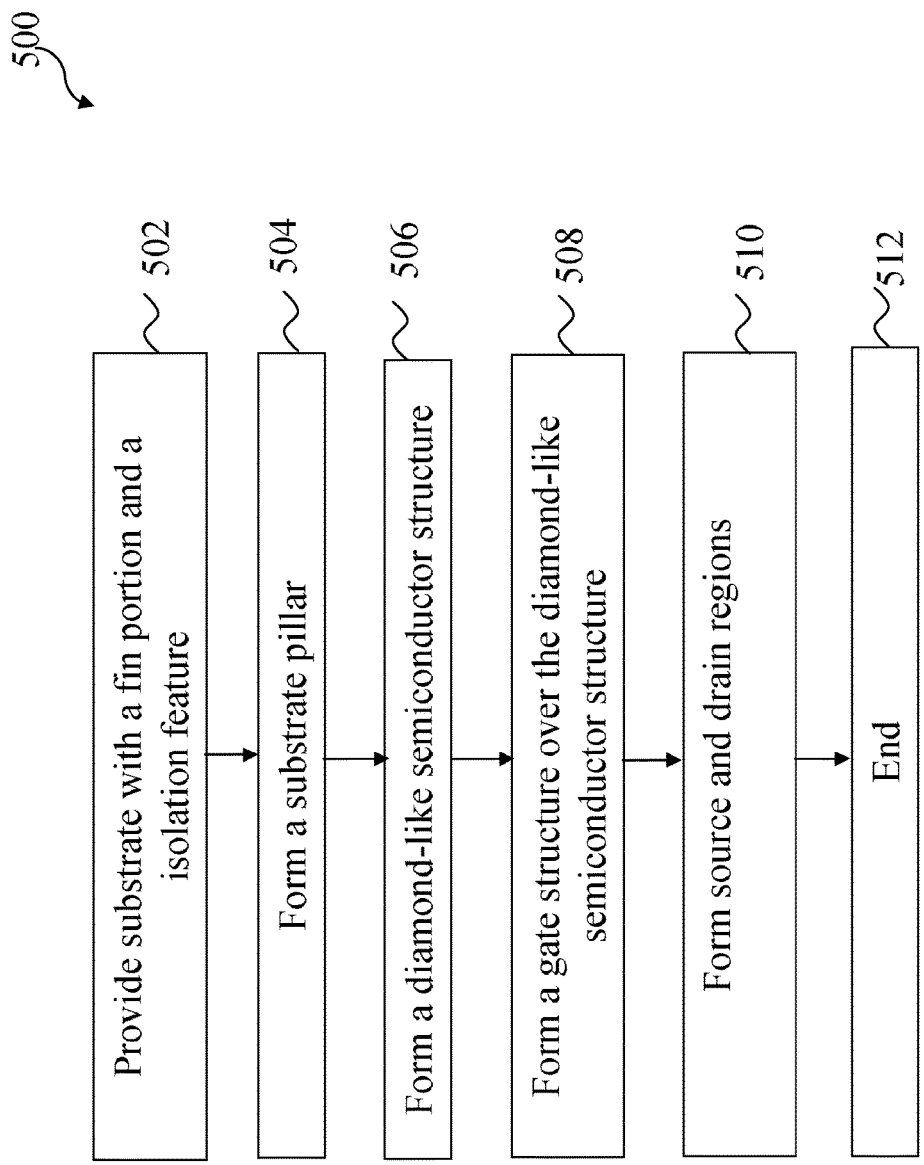
FIG. 13 is a flow chart of a method of fabricating a FinFET device with yet another diamond-like shape gate structure according to aspects of the present disclosure.

FIG. 13 is a flow chart of a method 500 for fabricating yet another device according to various aspects of the present disclosure. The method 500 begins at block 502 wherein a substrate with a fin portion structure and an isolation feature is provided. At block 504, a substrate pillar structure is formed by recessing the isolation feature. At block 506, a semiconductor material epitaxialy grows over the pillar and forms a diamond-like shape semiconductor structure. At block 508, a gate structure is formed over the diamond-like shape semiconductor structure. At block 510, source and drain regions are formed. At block 512, formation of the device is completed. Additional steps can be provided before, during, and after the method 500, and some of the steps described can be replaced or eliminated for other embodiments of the method. The discussion that follows illustrates various embodiments of an integrated circuit device that can be fabricated according to the method 500 of FIG. 13.

FIGS. 14-17 are various diagrammatic cross-sectional views, and FIG. 18 is a perspective view, of a device 600, in portion or entirety, at various stages of fabrication according to the method 500 of FIG. 13. The device 600 includes yet another diamond-like shape semiconductor structure that may serve as a gate channel of a FET, a MOSFET, a FinFET; or a 3-D substrate of a MEMS device. In the depicted embodiment, the diamond-like shape semiconductor structure is a portion of a gate structure of a FinFET device, where a channel will be induced by a positive or negative charge on the gate structure. FIGS. 14-18 have been simplified for the sake of clarity to better understand the inventive concepts of the present disclosure. Additional features can be added in the device 600, and some of the features described below can be replaced or eliminated in other embodiments of the device 600.

Figure 14:
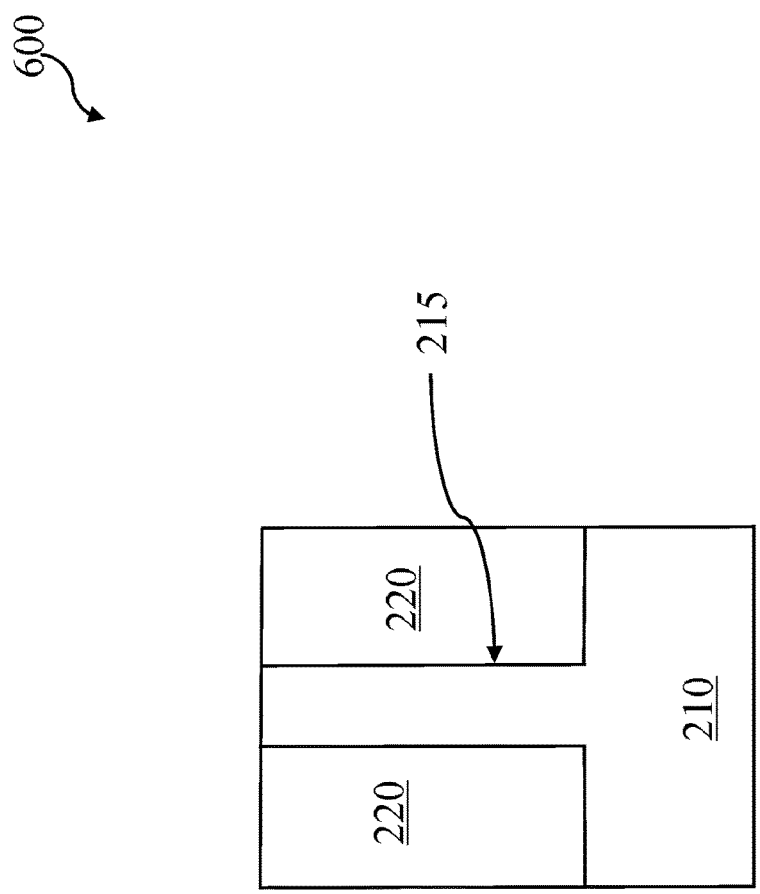
FIGS. 14-17 are various diagrammatic cross-sectional views of a FinFET device with a diamond-like shape gate structure at various fabrication stages according to the method of FIG. 13.

FIG. 14 illustrates the substrate 210 with the fin portion 215 and the isolation feature 220 disposed therein. The substrate 210, the fin portion 215, and the isolation feature 220 are described in FIG. 2 above.

Figure 15:
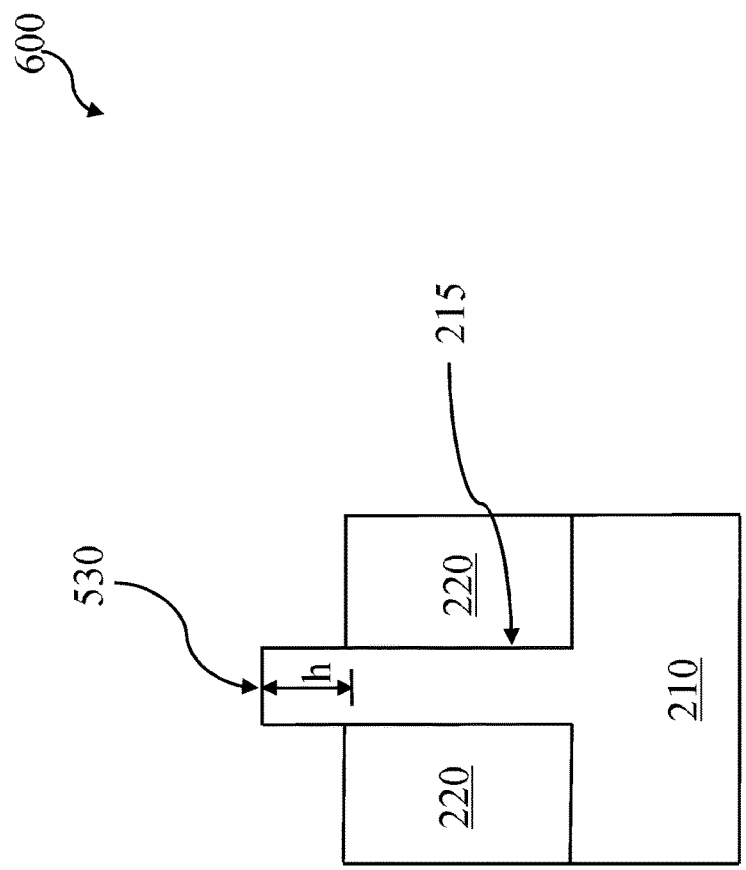

FIG. 15 illustrates forming a substrate pillar 530 by etching back the isolation feature 220. An etch technique includes a selective wet etch, such as HF solution, or any suitable selective dry etch. The substrate pillar 530 is a portion of the fin 215 and has a rectangular-shaped profile, including right and left sidewall surfaces perpendicular to a top surface of the substrate pillar 530. A height h of the substrate pillar 530 is controlled by etch depth.

Figure 16:
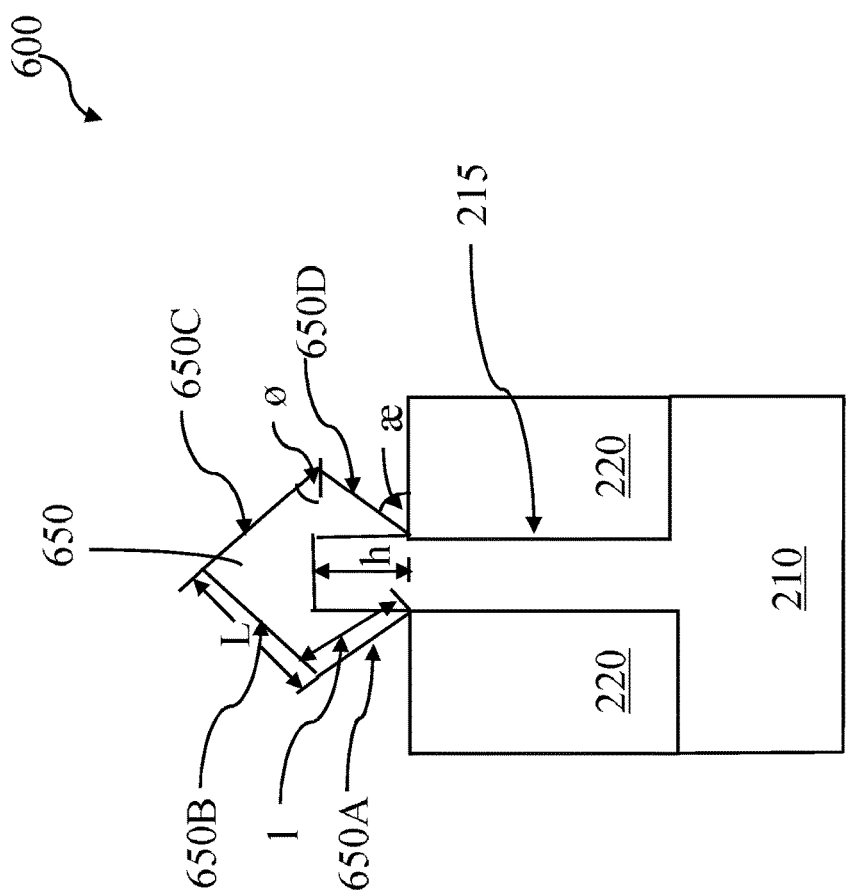

In FIG. 16, a semiconductor material grows epitaxially over the substrate pillar 530 to form a semiconductor structure 650.The formation of the semiconductor structure 650 is similar in many respects to the formation of the semiconductor structure 250, described in FIG. 4. In the depicted embodiment, Ge (111) epitaxially grows over the substrate pillar 530 to form the semiconductor structure 650. In FIG.16, the semiconductor structure 650 has a diamond-like shape. In the depicted embodiment, the semiconductor structure 450 has four facets, 450A, 450B, 450C and 450D. The shape of the semiconductor structure 650 is similar in many respects to the semiconductor structure 450 of FIG. 10, except that, by epitaxially growing over the substrate pillar 650, the length of facets 650A and 650D may grow much longer than those in the semiconductor structure 450. Both L and l can be controlled by the height h of the pillar and epitaxial growth process conditions, such as growth rate and growth time.

Figure 17:
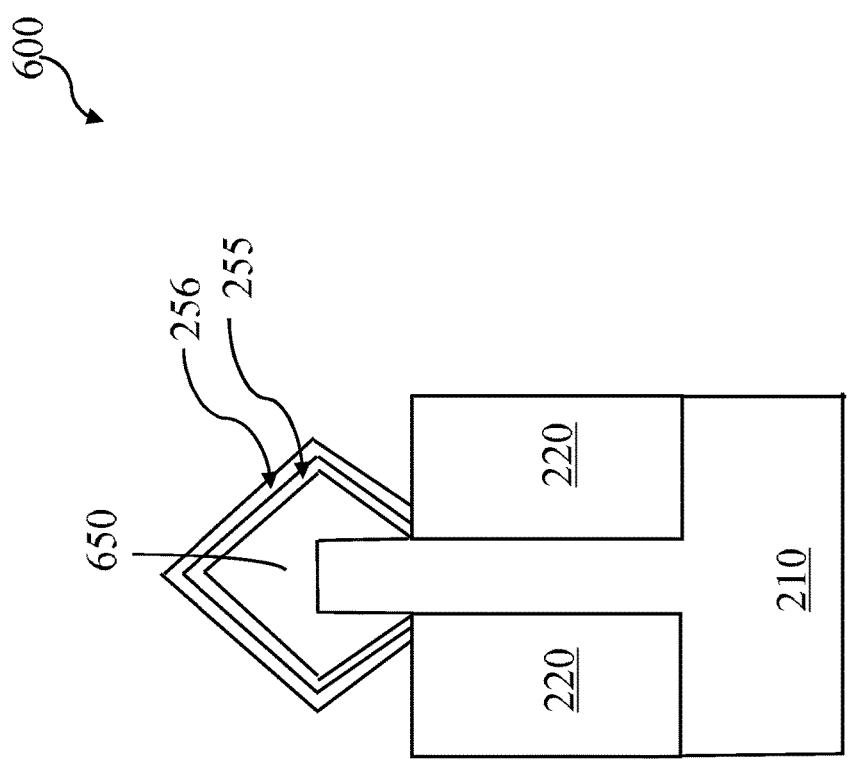

In the depicted embodiment, the semiconductor structure 650 serves as a channel of the device 600, specifically a n-channel FinFET device. In FIGS. 17 and 18, the gate structure including the gate dielectric layers 255 and 256 and the gate electrode 260 are formed over the diamond-like shape semiconductor structure 650. In FIG. 18, the source/drain 270/280 is formed. A formation of the gate structure, source region, and drain region of the device is similar in many respects to the device 200 of FIGS. 5 and 6.

Each device 200, 400, and 600 may include additional features, which may be formed by subsequent processing. For example, various contacts/vias/lines and multilayer interconnect features (e.g., metal layers and interlayer dielectrics) may be formed over the substrate, configured to connect the various features or structures of the devices 200, 400, and 600. The additional features may provide electrical interconnection to the devices 200, 400, and 600. For example, a multilayer interconnection includes vertical interconnects, such as conventional vias or contacts, and horizontal interconnects, such as metal lines. The various interconnection features may implement various conductive materials including copper, tungsten, and/or silicide.

In the depicted embodiment, by building a gate structure of a FinFET device on the diamond-like shape Ge (111) semiconductor structure, an n-channel of the FinFET device will be induced within the Ge (111) semiconductor. With Ge (111)'s good quality of dielectric interface with oxide materials, such as GeO$_2$, and with Ge (111)'s intrinsic higher carrier mobility, an n-channel FinFET device may achieve a higher switch speed and a larger on current compared to an n-channel within a Si (100) semiconductor or a Ge (100) semiconductor of a FinFET device. Alternatively, the diamond-like shape Ge (111) semiconductor structure may be used for a p-channel of a FET device; a MOSFET device; and a FinFET device with a higher hole mobility comparing with a Si channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
removing a portion of a semiconductor substrate to form a fin structure, the fin structure being formed of a first semiconductor material and disposed between an isolation feature, the fin structure having a top surface facing away from the semiconductor substrate that is exposed;
removing a portion of the isolation feature to form a portion of the fin structure that extends above the isolation feature, wherein the portion of the fin structure has the top surface and opposing sidewall surfaces such that the top surface extends between the opposing sidewall surfaces, wherein the top surface remains exposed during the removal of the portion of the isolation feature, wherein removing the portion of the isolation feature to form the portion of the fin structure exposes the opposing sidewall surfaces; and
epitaxially growing a second semiconductor material directly on the opposing sidewall surfaces of the portion of the fin structure that extends above the isolation feature to form a semiconductor structure over the fin structure.

2. The method of claim 1, further comprising forming the isolation feature around the fin structure.

3. The method of claim 1, wherein epitaxially growing the second semiconductor material directly on the opposing sidewall surfaces of the portion of the fin structure includes epitaxially growing the second semiconductor material directly on the top surface of the portion of the fin structure.

4. The method of claim 1, wherein the isolation feature is a shallow trench isolation structure.

5. The method of claim 1, further comprising:
forming a high-k dielectric layer over the second semiconductor material; and
forming a metal gate electrode over the high-k dielectric layer.

6. The method of claim 5, wherein forming the metal gate electrode over the high-k dielectric layer incudes forming the metal gate electrode directly on the isolation feature such that the metal gate electrode physically contacts the isolation feature.

7. The method of claim 1, wherein the semiconductor structure includes a first surface, a second surface, a third surface, and a fourth surface, wherein each of the first, second, third, and fourth surfaces have the same crystal plane orientation.

8. A method comprising:
forming a fin structure of a first semiconductor material over a semiconductor substrate, wherein the fin structure has opposing sidewall surfaces and a topmost surface that extends between the opposing sidewall surfaces;
forming an isolation feature around the fin structure, wherein after forming the isolation feature around the fin structure the topmost surface of the fin structure is exposed;
removing a portion of the isolation feature to expose the opposing sidewall surfaces of the fin structure;
forming a feature of a second semiconductor material over the fin structure such that the feature physically contacts the opposing sidewall surfaces of the fin structure;
forming a gate dielectric layer directly on the feature; and
forming a gate electrode over the gate dielectric layer.

9. The method of claim 8, wherein forming the feature of the second semiconductor material over the fin structure includes performing a epitaxial growth process.

10. The method of claim 8, wherein the second semiconductor material is different than the first semiconductor material.

11. The method of claim 8, wherein forming the gate electrode over the gate dielectric layer includes forming the gate electrode directly on the isolation feature such that the gate electrode physically contacts the isolation feature.

12. The method of claim 8, wherein the feature has a first surface of a first crystal plane orientation and the fin structure is without any surface having the first crystal plane orientation.

13. The method of claim 12, wherein the first crystal plane orientation is a (111) crystallographic orientation.

14. A method comprising:
forming a fin structure of a first semiconductor material over a semiconductor substrate, wherein the fin structure has a first sidewall and an opposing second sidewall and a topmost surface that extends from the first sidewall to the second sidewall;
forming a dielectric isolation feature along the first and second sidewalls of the fin structure, wherein after forming the dielectric isolation feature along the first and second sidewalls of the fin structure the topmost surface of the fin structure is exposed;
removing a portion of the dielectric isolation feature to expose the first sidewall of the fin structure; and
forming a second semiconductor material directly on the exposed first sidewall such that the second semiconductor material physically contacts the first sidewall of the fin structure.

15. The method of claim 14, wherein removing the portion of the dielectric isolation feature to expose the first sidewall of the fin structure includes removing another portion of the dielectric isolation feature to expose the second sidewall of the fin structure.

16. The method of claim 15, wherein forming the second semiconductor material directly on the exposed first sidewall such that the second semiconductor material physically contacts the first sidewall of the fin structure includes forming the second semiconductor material directly on the exposed second sidewall such that the second semiconductor material physically contacts the second sidewall of the fin structure.

17. The method of claim 14, further comprising:
   forming a gate dielectric layer over the second semiconductor material; and
   forming a gate electrode over the gate dielectric layer.

18. The method of claim 17, further comprising forming a source/drain feature adjacent the fin structure after forming the gate electrode over the gate dielectric layer.

19. The method of claim 17, wherein the gate dielectric layer physically contacts the dielectric isolation feature, and
   wherein the gate electrode physically contacts the dielectric isolation feature.

20. The method of claim 14, wherein the first semiconductor material includes silicon and the second semiconductor material includes germanium.

* * * * *